(12) United States Patent
Walczyk et al.

(10) Patent No.: US 10,935,573 B2
(45) Date of Patent: Mar. 2, 2021

(54) SLIP-PLANE MEMS PROBE FOR HIGH-DENSITY AND FINE PITCH INTERCONNECTS

(71) Applicant: Intel Corporation, Santa Clara, CA (US)

(72) Inventors: Joe Walczyk, Tigard, OR (US); Pooya Tadayon, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 155 days.

(21) Appl. No.: 16/145,571

(22) Filed: Sep. 28, 2018

(65) Prior Publication Data
US 2020/0103440 A1   Apr. 2, 2020

(51) Int. Cl.
| | |
|---|---|
| *G01R 1/06* | (2006.01) |
| *G01R 1/067* | (2006.01) |
| *G01R 3/00* | (2006.01) |
| *B81B 7/02* | (2006.01) |
| *H01L 23/00* | (2006.01) |
| *G01R 31/26* | (2020.01) |

(52) U.S. Cl.
CPC ............ *G01R 1/06794* (2013.01); *B81B 7/02* (2013.01); *G01R 1/06711* (2013.01); *G01R 3/00* (2013.01); *G01R 31/2601* (2013.01); *H01L 24/17* (2013.01)

(58) Field of Classification Search
CPC .......... G01R 3/00; G01R 1/06711; B81B 7/02
See application file for complete search history.

(56) References Cited

U.S. PATENT DOCUMENTS

| | | |
|---|---|---|
| 5,307,560 A | 5/1994 | Aksu |
| 5,453,701 A | 9/1995 | Jensen et al. |
| 5,592,222 A | 1/1997 | Nakamura et al. |
| 5,917,329 A | 6/1999 | Cadwallader et al. |
| 6,130,545 A | 10/2000 | Kiser et al. |
| 6,292,004 B1 | 9/2001 | Kocher |
| 6,356,090 B2 | 3/2002 | Deshayes |
| 6,441,315 B1 | 8/2002 | Eldridge et al. |
| 7,189,077 B1 | 3/2007 | Eldridge et al. |

(Continued)

FOREIGN PATENT DOCUMENTS

| | | |
|---|---|---|
| EP | 0962776 | 12/1999 |
| JP | 11-344510 | 12/1999 |

OTHER PUBLICATIONS

Darling, K.A. et al., "Mitigating grain growth in binary nanocrystalline alloys through solute selection based on thermodynamic stability maps", Computational Material Science; 84 (2014), 255-266.

(Continued)

*Primary Examiner* — Alvaro E Fortich
(74) *Attorney, Agent, or Firm* — Green, Howard & Mughal LLP.

(57) ABSTRACT

A device probe includes a primary probe arm and a subsequent probe arm with a slip plane spacing between the primary probe arm and subsequent probe arm. Each probe arm is integrally part of a probe base that is attachable to a probe card. During probe use on a semiconductive device or a semiconductor device package substrate, overtravel of the probe tip allows the primary and subsequent probe arms to deflect, while sufficient resistance to deflection creates a useful contact with an electrical structure such as an electrical bump or a bond pad.

18 Claims, 9 Drawing Sheets

(56) References Cited

U.S. PATENT DOCUMENTS

| | | |
|---|---|---|
| 7,436,193 B2 | 10/2008 | Crippen |
| 7,884,632 B2 | 2/2011 | Shiraishi et al. |
| 8,029,291 B2 | 10/2011 | Park |
| 2002/0024347 A1 | 2/2002 | Felici et al. |
| 2002/0163349 A1 | 11/2002 | Wada et al. |
| 2005/0151547 A1 | 7/2005 | Machida et al. |
| 2005/0231855 A1 | 10/2005 | Tran |
| 2006/0151614 A1 | 7/2006 | Nishizawa et al. |
| 2007/0126435 A1 | 6/2007 | Eldridge et al. |
| 2007/0126440 A1 | 6/2007 | Hobbs et al. |
| 2008/0088327 A1 | 4/2008 | Kister |
| 2008/0196474 A1 | 8/2008 | Di Stefano et al. |
| 2008/0204061 A1 | 8/2008 | Chartarifsky et al. |
| 2008/0231300 A1 | 9/2008 | Yamada et al. |
| 2008/0309363 A1* | 12/2008 | Jeon ............... G01R 1/0735 324/755.07 |
| 2009/0219047 A1 | 9/2009 | Peterson et al. |
| 2009/0237099 A1 | 9/2009 | Garabedian et al. |
| 2010/0052715 A1 | 3/2010 | Beaman et al. |
| 2010/0066393 A1 | 3/2010 | Bottoms et al. |
| 2010/0079159 A1 | 4/2010 | Kemmerling |
| 2010/0276572 A1 | 11/2010 | Iwabuchi et al. |
| 2011/0031991 A1* | 2/2011 | Lee ............... G01R 1/07371 324/756.03 |
| 2011/0115513 A1 | 5/2011 | Harada |
| 2011/0234251 A1 | 9/2011 | Komatsu et al. |
| 2012/0038383 A1 | 2/2012 | Wu et al. |
| 2012/0071037 A1* | 3/2012 | Balucani ........... G01R 1/07357 439/851 |
| 2012/0117799 A1 | 5/2012 | Luo |
| 2012/0319710 A1 | 12/2012 | Dabrowiecki et al. |
| 2013/0002285 A1 | 1/2013 | Nelson et al. |
| 2013/0099812 A1* | 4/2013 | Wang ............. G01R 31/2889 324/755.01 |
| 2013/0200910 A1 | 8/2013 | Ellis-Monaghan et al. |
| 2014/0021976 A1 | 1/2014 | Tanaka |
| 2014/0125372 A1 | 5/2014 | Fukasawa et al. |
| 2014/0253162 A1 | 9/2014 | Wang |
| 2014/0347085 A1 | 11/2014 | Kuo et al. |
| 2014/0362425 A1 | 12/2014 | Stephens et al. |
| 2014/0363905 A1 | 12/2014 | McShane et al. |
| 2015/0123693 A1 | 5/2015 | Ota et al. |
| 2015/0192633 A1 | 7/2015 | Garibay et al. |
| 2016/0079635 A1 | 3/2016 | Niwa |
| 2016/0178663 A1 | 6/2016 | Prabhugoud et al. |
| 2017/0219626 A1 | 8/2017 | Gardell et al. |
| 2018/0003767 A1 | 1/2018 | Crippa et al. |
| 2019/0212366 A1 | 7/2019 | Tadayon et al. |
| 2020/0025801 A1 | 1/2020 | Tadayon et al. |

OTHER PUBLICATIONS

Luo, J.K. et al., "Young's modulus of electroplated Ni thin film for MEMS applications", Materials Letters, vol. 58, Issues 17-18, Jul. 2004, pp. 2306-2309.

Weeden, et al., "Probe Card Tutorial", www.tek.com/keithley, 2003, 40 pages, Keithley Instruments, Inc.

Wikipedia, "Probe Card", last edited on Jul. 29, 2016, 2 pages, Wikipeadia, https://en.wikipedia.org/wiki/probe_card.

\* cited by examiner

SLIP-PLANE MEMS PROBE FOR HIGH-DENSITY AND FINE PITCH INTERCONNECTS

FIELD

This disclosure relates to semiconductive device under test probing.

BACKGROUND

Miniaturization of semiconductive devices packages, leaves smaller spaces with which to probe and test interconnects.

BRIEF DESCRIPTION OF THE DRAWINGS

Various disclosed embodiments of are illustrated by way of example, and not by way of limitation, in the figures of the accompanying drawings and in which.

DETAILED DESCRIPTION

Disclosed embodiments include meeting scaling challenges for micro electro-mechanical (MEMs) requirements of test probes where spring-force resiliency during probe overtravel is preserved for high-count test repetitions. Stable contact resistances are achieved during probe overtravel contact while keeping bending stresses in useful ranges as to not permanently deform the structure.

In an embodiment, a composite probe beam, also referred to as a "diving board MEMs" (micro electro-mechanical) probe beam includes a slip plane along the sagittal axis of the probe beam, where each beam of the composite probe beam is individually anchored and integral to a probe base, while a primary probe beam of the composite probe beam includes the probe tip on the probe foot. During operation, the device-under-test (DUT) is in physical contact with the probe tip, and stresses within the composite probe beam, are shared with reduce overall bending stresses.

Figure 1A:
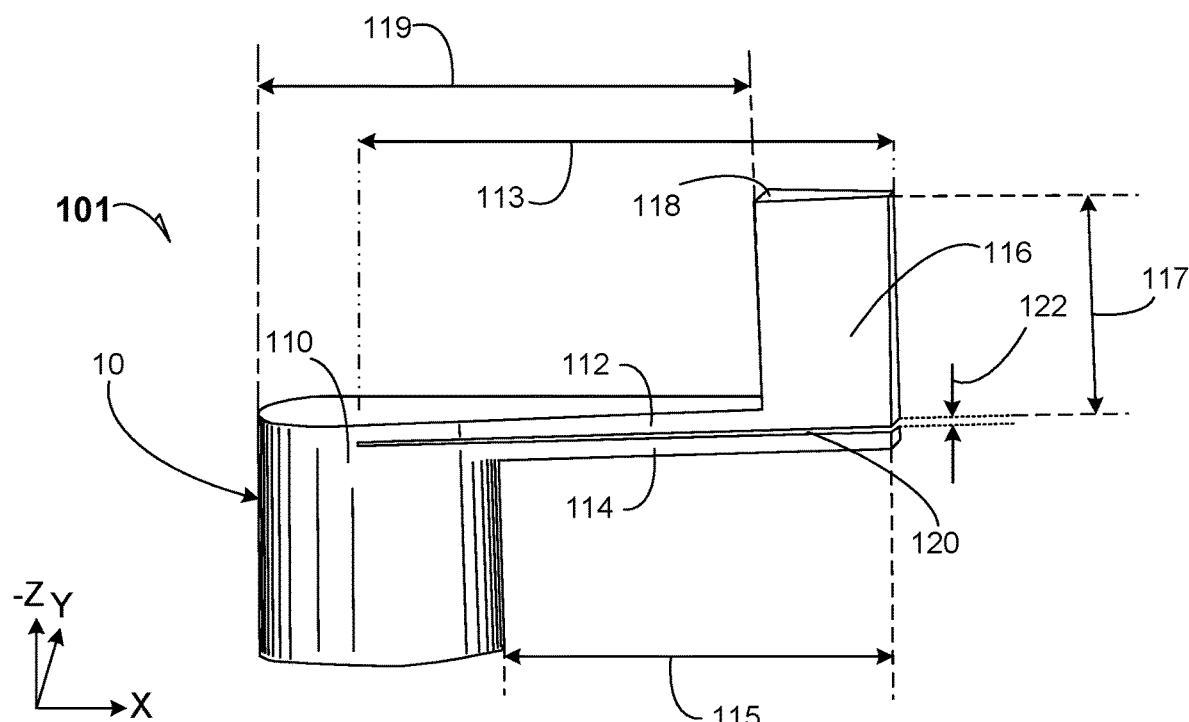
FIG. 1A is a perspective elevation of a device probe during use according to an embodiment.

FIG. 1A is a perspective elevation 101 of a device probe 10 during use according to an embodiment. The device probe 10 includes a probe base 110, a primary probe arm 112 that is metallurgically an integral part of the bulk of the probe base 110, as well as a subsequent probe arm 114, that as well is metallurgically an integral part of the bulk of the probe base 110. The device probe 10 also includes a probe foot 116 and a probe tip 118 that is part of the probe foot 116.

Throughout this disclosure, the occurrence of a probe foot such as the probe foot 116 is at a distal end of the probe arm such as the primary probe arm 112. The probe base such as the probe base 110 is at a proximal end of the probe arm such as the primary probe arm 112.

The probe foot 116 includes the probe tip 118, to make contact with an electrical structure for a DUT technique, such as at an electrical bump like a solder bump, at a copper pillar, or at a bond pad among other locations. During deflection of the probe arms 112 and 114, the probe tip 118 will travel laterally (X-direction) from an original reference length 119 to a deflected reference length 119' (see FIG. 1B). Similarly during deflection of the probe arms 112 and 114, the probe tip 118 will overtravel (Z-direction) from an original reference height 117 to an overtravel distance 124 (see FIG. 1B). The overtravel distance 124 is achieved to make a useful DUT contact with an electrical structure.

In an embodiment, the primary probe arm 112 has a primary effective bending length 113 where the primary probe arm 112 extends from the bulk of the probe base 110. The primary effective bending length 113 is affected, however, by structure and proximity of the subsequent probe arm 114. The probe arm bending length includes the portion of the device probe 10 that bends.

In an embodiment, the subsequent probe arm 114 is separated from the primary probe arm 112 by a primary slip plane 120 that includes a primary slip spacing 122 between the primary probe arm 112 and the subsequent probe arm 114. In an embodiment, the subsequent probe arm 114 has a subsequent effective bending length 115 where the subsequent probe arm 114 extends from the bulk of the probe base 110.

In an embodiment, the probe foot 116 has a probe foot height 117 that can be measured from the edge of the primary slip-plane spacing 122 at the base of the probe foot 116.

Figure 1B:
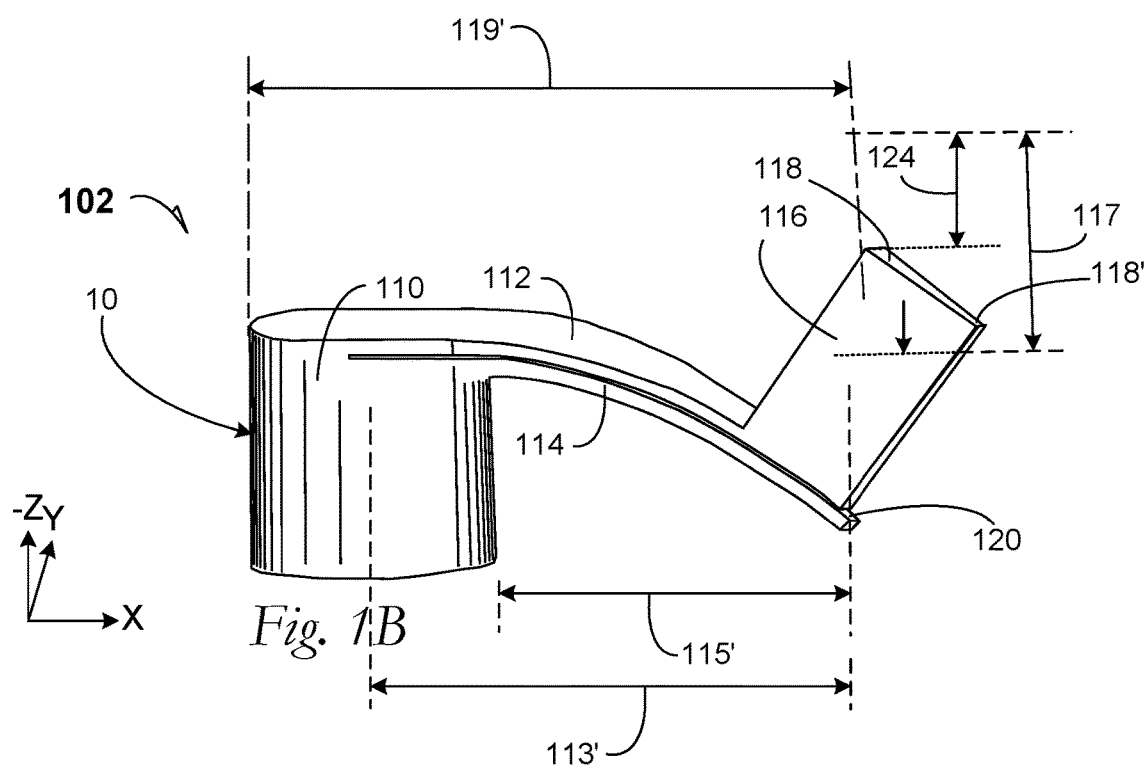
FIG. 1B is a perspective elevation of the device probe depicted in FIG. 1A, while the probe foot experiences overtravel and while the primary probe arm and the subsequent probe arm are under deflection caused by overtravel of the probe foot where it encounters a contact point of a device under test according to an embodiment.

FIG. 1B is a perspective elevation 102 of the device probe 10 depicted in FIG. 1A, while the probe foot 116 experiences overtravel 124 and while the primary probe arm 112 and the subsequent probe arm 114 are under deflection caused by overtravel 124 of the probe foot 116 where it encounters a contact point (not illustrated) of a DUT according to an embodiment. As illustrated, the device probe 10 acts as a micro-electro-mechanical system (MEMS) with deflecting probe arms that move relative to a slip plane.

In an embodiment, the probe base 110 does not effectively change shape nor have significant deflection during a DUT technique. The primary probe arm 112 is deflected with a deflected effective primary bending length 113' that is shorter than the original effective primary bending length 113. Similarly, the subsequent probe arm 114 is deflected with an effective deflected subsequent bending length 115' that is shorter than the original deflected effective subsequent bending length 115.

During deflection of the primary probe arm 112 and the subsequent probe arm 114, the primary probe arm 112 slides along the slip plane 120 such that a given overtravel 124 of the probe tip 118, the subsequent probe arm 114 has the appearance of being longer than the primary probe arm 112. By use of the slip plane 120, a bending stress is usefully reduced, compared to a bending stress that would appear within a single probe arm that would effectively be the thickness (Z-direction) of the primary probe arm 112 and the subsequent probe arm 114.

Also during deflection of the probe arm 112 and the subsequent probe arm 114, the probe tip 118 travels laterally (X-direction) across the item it is contacting, from an original reference length 119 to a deflected reference length 119'.

In an embodiment, Z-direction overtravel 124 is measured by the original position of the probe tip 118 (see FIG. 1A) and the bottom of the primary probe arm 112 at the slip plane 120 as also indicated by a boundary of the primary slip-plane spacing 122. In an embodiment, overtravel 124 is measured by applying a 1 gram force at the probe tip 118, and in a range from 0.5 micrometer ($\mu m$) to about 16 $\mu m$ at the probe tip 118. Similarly, the distal end 118' of the probe tip 118, moves in a range from 1 $\mu m$ to about 26 $\mu m$ where the probe tip 118 is the proximal end that makes physical and electrical contact during a DUT technique.

In any event, where a neutral axis exists in either of the primary probe arm 112 and the subsequent probe arm 114, a given metal grain structure movement at the neutral axis, is reduced compared to a thicker probe arm that must still bear the bending stress to achieve sufficient contact at the DUT.

In an embodiment, formation of the primary probe arm 112 is done by electroplating the primary probe arm 112 onto an exposed portion of the probe base 110, where the subsequent probe arm 114 was first formed with the probe base 110, and a fugitive spacer (not illustrated) takes up the slip plane 120 with a thickness that is effectively the Z-direction thickness of the primary slip spacing 122. After formation of the primary probe arm 112, the fugitive spacer is removed such as by melting, sublimation, or release heating.

In an embodiment, the primary probe arm 112 is metallurgically identical to the to the subsequent probe arm 114. In an embodiment, the primary probe arm 112 is metallurgically different from the subsequent probe arm 114, while the primary probe arm 112 is still metallurgically integral with the probe base 110 as achieved during electroplating. For example, the primary probe arm 112 has a more useful ductility, while the subsequent probe arm 114 has a more useful stiffness. In other words, the primary probe arm 112 is chemically different from the subsequent probe arm 114 in an embodiment.

Figure 2A:
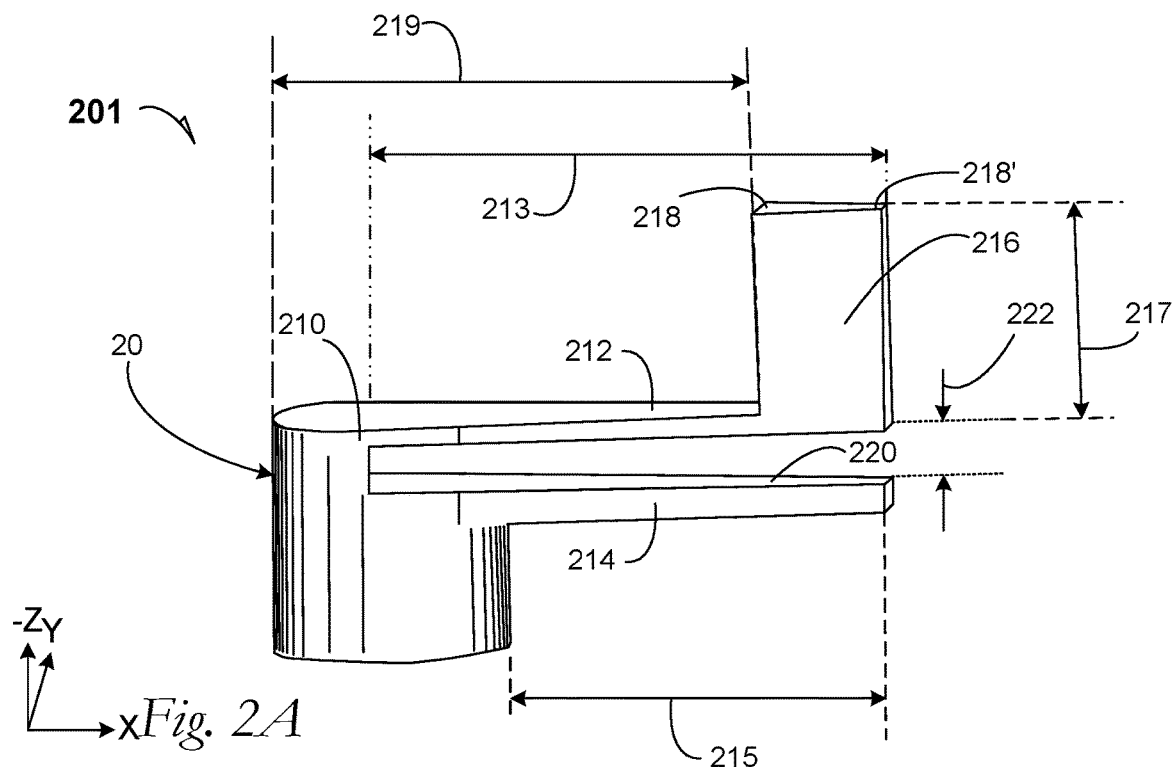
FIG. 2A is a perspective elevation of a device probe during use according to an embodiment.

FIG. 2A is a perspective elevation 201 of a device probe 20 during use according to an embodiment. The device probe 20 includes a probe base 210, a primary probe arm 212 that is metallurgically an integral part of the bulk of the probe base 210, as well as a subsequent probe arm 214, that as well is metallurgically an integral part of the bulk of the probe base 210.

The device probe 20 also includes a probe foot 216 and a probe tip 218 that is part of the probe foot 216, where the probe tip 218 is to make contact with an electrical structure for a DUT technique, such as at an electrical bump like a solder bump, at a copper pillar, or at a bond pad among other locations. During deflection of the probe arms 212 and 214, the probe tip 218 will travel laterally (X-direction) across the item it is contacting, from an original reference length 219 to a deflected reference length similar to the deflected reference length 119' depicted in FIG. 1B.

In an embodiment, the primary probe arm 212 has a primary effective bending length 213 where the primary probe arm 212 extends from the bulk of the probe base 210. The primary effective bending length 213 is affected, however, by structure and proximity of the subsequent probe arm 214.

In an embodiment, the subsequent probe arm 214 is separated from the primary probe arm 212 by a primary slip plane 220 that includes a primary slip spacing 222 between the primary probe arm 212 and the subsequent probe arm 214. In an embodiment, the subsequent probe arm 214 has a subsequent effective bending length 215 where the subsequent probe arm 214 extends from the bulk of the probe base 210.

In an embodiment, the probe foot 216 has a probe foot height 217 that can be measured from the edge of the primary slip-plane spacing 222 at the base of the probe foot 216.

Figure 2B:
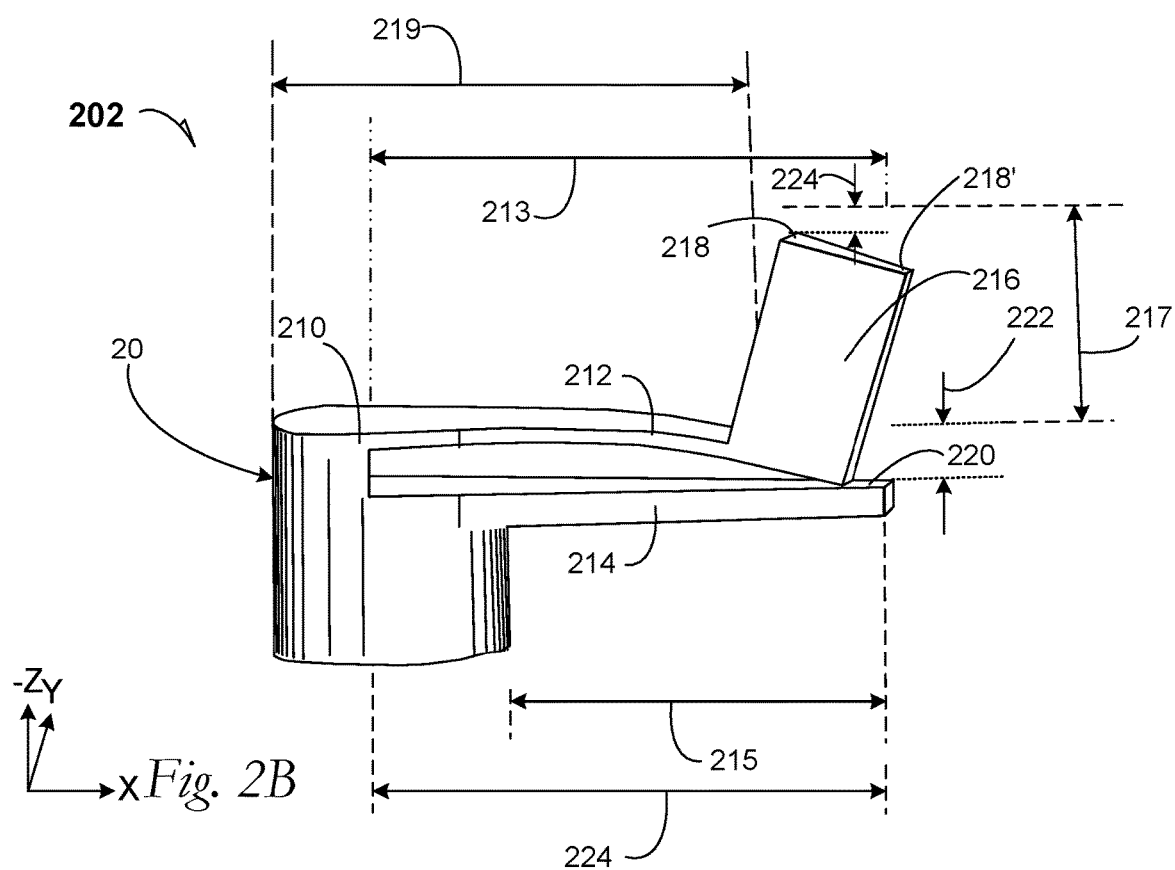
FIG. 2B is a perspective elevation of the device probe depicted in FIG. 2A during further use according to an embodiment.

FIG. 2B is a perspective elevation 202 of the device probe 20 depicted in FIG. 2A during further use according to an embodiment. As illustrated, the device probe 20 acts as a micro-electro-mechanical system (MEMS) with deflecting probe arms that move relative to a slip plane.

During deflection of the probe arms 214 and 216, the probe foot 216 experiences overtravel and while the primary probe arm 212 and the subsequent probe arm 214 are under deflection caused by overtravel 224 of the probe foot 216 where it encounters a contact point (not illustrated) of a DUT according to an embodiment, the probe foot 216 encounters the subsequent probe arm 214 after closing the gap in the primary slip-plane spacing 222. Thus where useful overtravel 224 of the probe foot 216 is not sufficient to close the gap in the primary slip-plane spacing 222, the subsequent probe arm 214 is not contacted. In an embodiment, however, where overtravel 224 of the probe foot 216 is sufficient to close the gap in the primary slip-plane spacing 222, the subsequent probe arm 214 also begins to deflect but to provide useful Z-direction physical resistance to deflection.

As illustrated, the primary probe arm 212 has begun to contact the subsequent probe arm 214 without obvious deflection in the subsequent probe arm 214.

In an embodiment, the primary probe arm 212 is thinner in the Z-direction compared to the subsequent probe arm 214, and where the gap in the primary slip-plane spacing 222 is closed, more resistance to overtravel of the probe foot 216 is encountered to assist in making a useful electrical contact to a contact structure for a DUT technique.

In this embodiment, the probe base 210 does not effectively change shape nor have significant deflection during a DUT technique. The primary probe arm 212 is deflected, but significant bending stress is born by the subsequent probe arm 214, whether or not it is thicker in the Z-direction.

In an embodiment, overtravel 224 is measured by the original position of the probe tip 218 and the bottom of the primary probe arm 212 at the slip plane 220 as also indicated by the primary slip-plane spacing 222. (See FIG. 2A). In an embodiment, overtravel 224 is measured by applying a 1-gram force at the probe tip 218, and in a range from 0.5 micrometer ($\mu m$) to about 16 $\mu m$ at the probe tip 218. Similarly, the distal end 218' of the probe tip 218, moves in a range from 1 $\mu m$ to about 26 $\mu m$.

In any event, where a neutral axis exists in either of the primary probe arm 212 and the subsequent probe arm 214, a given metal grain structure movement at the neutral axis, is reduced compared to a thicker probe arm that must still bear the bending stress to achieve sufficient contact at the DUT.

In an embodiment, the primary probe arm 212 is metallurgically identical to the to the subsequent probe arm 214. In an embodiment, the primary probe arm 212 is metallurgically different from the subsequent probe arm 214, while the primary probe arm 212 is still metallurgically integral with the probe base 210 as achieved during electroplating. For example, the primary probe arm 212 has a more useful ductility, while the subsequent probe arm 214 has a more useful stiffness.

Figure 3A:
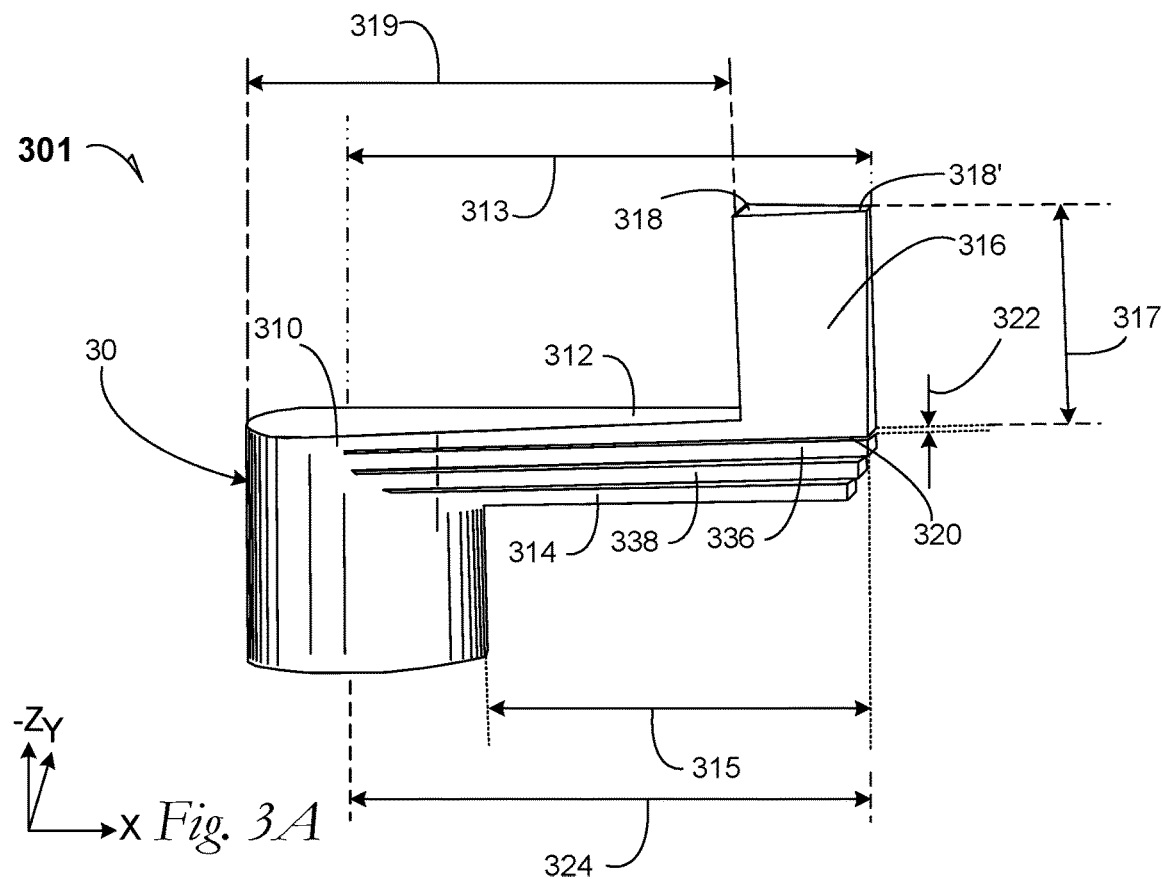
FIG. 3A is a perspective elevation of a device probe during use according to an embodiment.

FIG. 3A is a perspective elevation 301 of a device probe 30 during use according to an embodiment. The device probe 30 includes a probe base 310, a primary probe arm 312 that is metallurgically an integral part of the bulk of the probe base 310, a subsequent probe arm 314, that as well is metallurgically an integral part of the bulk of the probe base 310, and at least a third probe arm 336 that similarly is metallurgically an integral part of the bulk of the probe base 310. In an embodiment, the device probe 30 also includes a fourth probe arm 338 that is adjacent the second probe arm 336 and the subsequent probe arm 314, and that is metallurgically an integral part of the bulk of the probe base 310.

In the illustrated embodiment, the subsequent probe arm 314 is an $n^{th}$ probe arm 314 where n equals four. In an embodiment, n equals three. In an embodiment, n equals five. In an embodiment, n equals six. In an embodiment, the $n^{th}$ probe arm 314 is thicker in the Z-direction than any or all of the other probe arms. In an embodiment, the metallurgy of the successive probe arms is progressively stiffer while each probe arm is still metallurgically integral to the probe base 310 as achieved by successive electroplating.

In an embodiment, the primary probe arm 312 has a primary effective bending length 313 where the primary probe arm 312 extends from the bulk of the probe base 310. The primary effective bending length 313 is affected, however, by structure and proximity of the subsequent probe arm 314 as well as the third probe arm 336 (and the fourth probe arm 338 if present).

In an embodiment, the subsequent probe arm 314 is separated from the third probe arm 336 by a primary slip plane 320 that includes a primary slip spacing 322 between the primary probe arm 312 and the third probe arm 336. In an embodiment, the third probe arm 336 has a subsequent effective bending length 315' where the subsequent probe arm 314 extends from the bulk of the probe base 310.

In the probe foot 316 has a probe foot height 317 that can be measured from the edge of the primary slip-plane spacing 322 at the base of the probe foot 316.

In an embodiment, the probe foot 316 is part of the device probe 30, where a probe tip 318 that is part of the probe foot 316. The probe tip 318 is to make contact with an electrical structure for a DUT technique, such as at an electrical bump like a solder bump, at a copper pillar, or at a bond pad among other locations.

In an embodiment, each successive probe arm 336, 338 and 314 is progressively shorter along the X-direction than the primary probe arm 312.

Figure 3B:
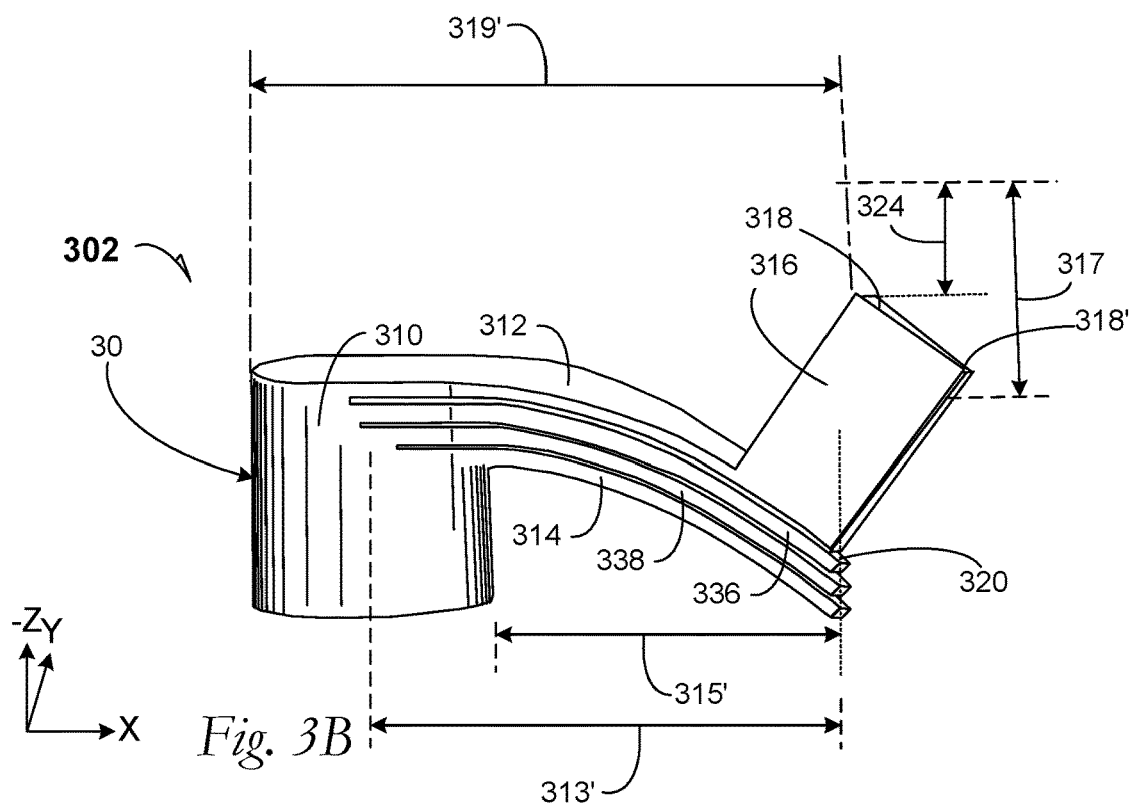
FIG. 3B is a perspective elevation of the device probe depicted in FIG. 3A during deflection according to several embodiments.

FIG. 3B is a perspective elevation 302 of the device probe 30 depicted in FIG. 3A during deflection according to several embodiments. As illustrated, the device probe 30 acts as a micro-electro-mechanical system (MEMS) with deflecting probe arms that move relative to slip planes. Although only the slip plane 320 is delineated, there is a slip plane between the subsequent probe arm 314 and the fourth probe arm 338, and there is a slip plane between the fourth probe arm 338 and the third probe arm 336.

During deflection of the probe arms 312, 314, 336 (and 338 if present), the probe tip 318 travels laterally (X-direction) across a contact test structure, from the original reference length 319 to a deflected reference length 319'.

During deflection of the probe arms 312, 336 and 314 (338 if present), the probe foot 216 experiences overtravel 324 and while the probe arms are under deflection caused by overtravel 324 of the probe foot 316 where it encounters a contact point 318 of a DUT according to an embodiment, the probe foot 316 encounters the third probe arm 336 after closing the gap in the primary slip-plane spacing 322.

In this embodiment, the probe base 310 does not effectively change shape nor have significant deflection during a DUT technique. The primary probe arm 312 is deflected, but significant bending stress is born by the subsequent probe arm 314, the third probe arm 336 (and the fourth probe arm 338 if present), whether or not they are thicker in the Z-direction.

In an embodiment, overtravel 324 is measured by the original position of the probe tip 318 (see, e.g. FIG. 3A) and the bottom of the primary probe arm 312 at the slip plane 320 as also indicated by the primary slip-plane spacing 322. In an embodiment, overtravel 324 is measured by applying a 1-gram force at the probe tip 318, and in a range from 0.5 micrometer (μm) to about 16 μm at the probe tip 318. Similarly, the distal end 318' of the probe tip 318, moves in a range from 1 μm to about 26 μm.

In any event, where a neutral axis exists in either of the primary probe arm 312, the subsequent probe arm 314, the third probe arm 336 (and the fourth probe arm 338 if present), a given metal grain structure movement at the neutral axis, is reduced compared to a thicker probe arm that must still bear the bending stress to achieve sufficient contact at the DUT.

In an embodiment, the primary probe arm 312 is metallurgically identical to the to the subsequent probe arm 314, the third probe arm 336 (and the fourth probe arm 338 if present). In an embodiment, the primary probe arm 312 is metallurgically different from the subsequent probe arm 314, the third probe arm 336 (and the fourth probe arm 338 if present), while the primary probe arm 312 is still metallurgically integral with the probe base 310 as achieved during electroplating. For example, the primary probe arm 312 has a more useful ductility than any other probe arm, while the subsequent probe arm 314 has a more useful stiffness.

Figure 4:
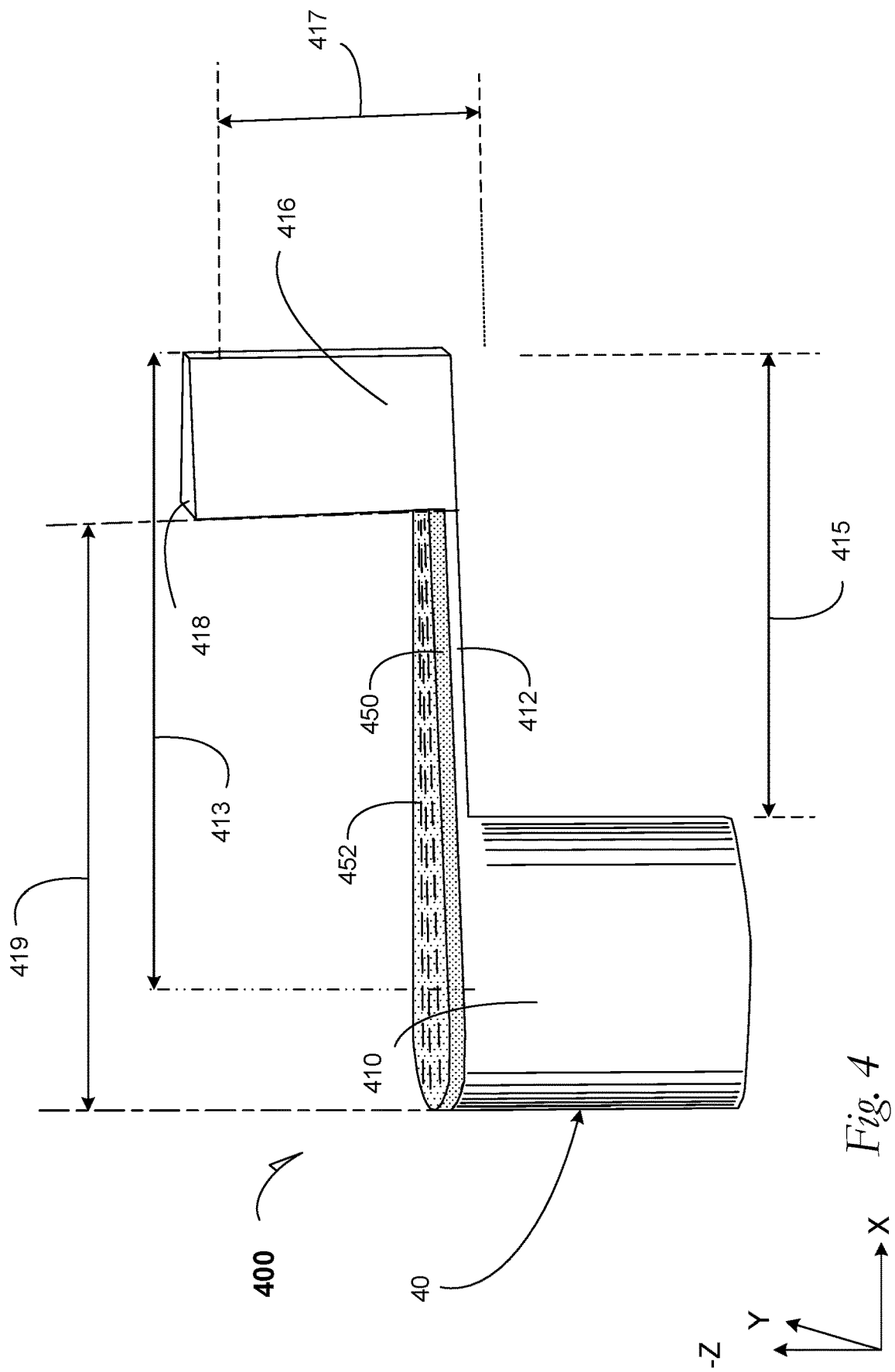
FIG. 4 is a perspective elevation of a device probe during use according to an embodiment.

FIG. 4 is a perspective elevation 400 of a device probe 40 during use according to an embodiment. As illustrated, the device probe 40 acts as a micro-electro-mechanical system (MEMS) with a deflecting probe arm which movement is restrained by a directionally strengthened organic film.

The device probe 40 includes a probe base 410 and a primary probe arm 412 that is metallurgically an integral part of the bulk of the probe base 410. The device probe 40 also an engineered organic probe-arm film 450, that is adhered to the primary probe arm 412. The device probe 40 also includes a probe foot 416 and a probe tip 418 that is part of the probe foot 416, where the probe tip 418 is to make contact with an electrical structure for a DUT technique, such as at an electrical bump like a solder bump, at a copper pillar, or at a bond pad among other locations.

During deflection of the primary probe arm 412 and the engineered organic probe-arm film 450, the probe tip 418 will travel laterally (X-direction) from an original reference length 419 to a deflected reference length (see e.g., the deflected reference length 319' in FIG. 3B). Similarly during deflection of the probe arm 412 and the engineered organic probe-arm film 450, the probe tip 418 will overtravel (Z-direction) from an original reference height 417 to an overtravel distance such as the overtravel distance 324 depicted in FIG. 3B. The overtravel distance is achieved to make a useful DUT contact with an electrical structure.

In an embodiment, the primary probe arm 412 has a primary effective bending length 413 where the primary probe arm 412 extends from the bulk of the probe base 410. The primary effective bending length 413 is affected, however, by internal structure of the engineered organic probe-arm film 450. For example, anisotropic fibers 452 (three occurrences depicted in dashed lines) are arrayed within the engineered organic probe-arm film 450, along the X-direction that resist bending of the primary probe arm 412. In an embodiment, the number of fibers 452 is in a range from one to three. In an embodiment, the number of fibers 452 is between four and 20.

In an embodiment, a structure such as the engineered organic probe-arm film 450 is used during assembly of any illustrated embodiment in FIGS. 1A, 1B, 2A, 2B, 3A and 3B. For example, the primary slip spacing 122 contains an engineered organic probe-arm film like the engineered organic probe-arm film 450, and where the film 450 resists bending, it is adhered only to the subsequent probe arm 114 but is allowed to slip along the primary probe arm 112 at the primary slip plane 120.

Figure 5:
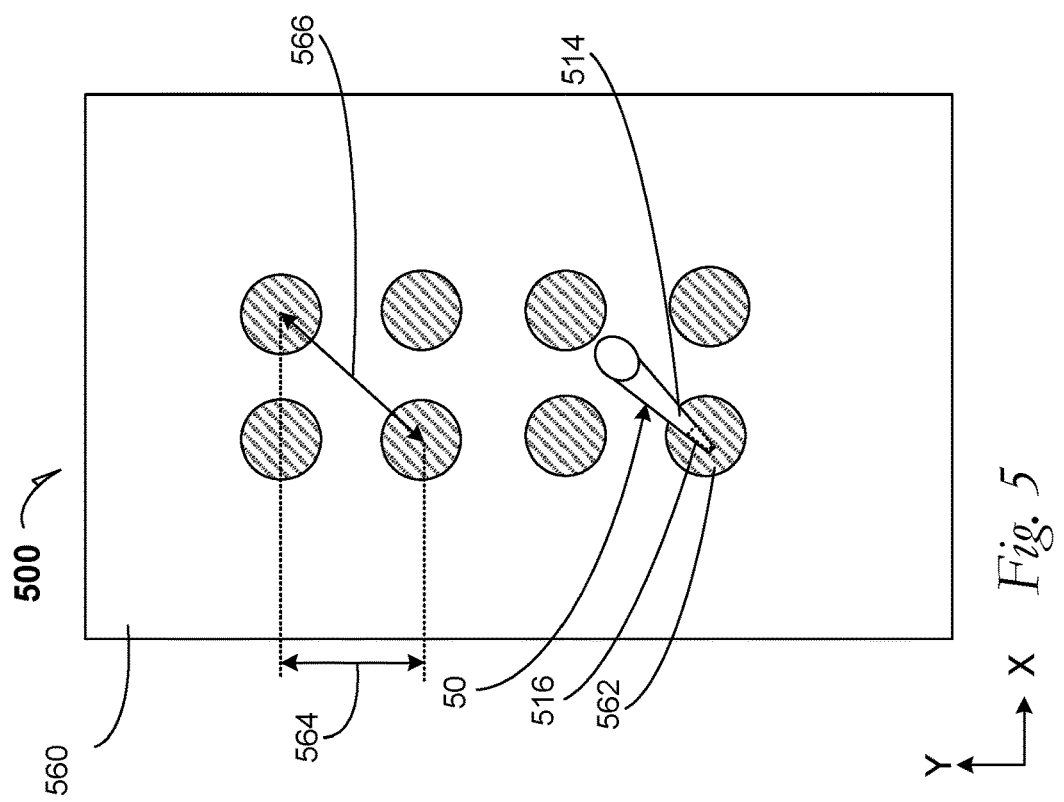
FIG. 5 is a top plan of a device under test according to an embodiment.

FIG. 5 is a top plan 500 of a device 560 under test according to an embodiment. In an embodiment the device 560 is semiconductive device such as a logic processor made by Intel Corporation of Santa Clara, Calif. The device under test (DUT) 560 is being probed at an electrical bump 562 that is part of a square-pitch bump array. In an embodiment, the square-pitch bump array has an orthogonal pitch 564 of 36 μm and a diagonal pitch 566 of 51 μm.

In an embodiment, a device probe 50 includes a probe body 510, a primary probe arm (not visible), and a subsequent probe arm 514. A probe foot 516 (in ghosted lines) extends (toward the plane of the drawing) to make contact with the electrical bump 562. In an embodiment where overtravel of the probe foot 516 occurs, the probe foot moves diagonally away from the probe body 510, but it retains contact with the electrical bump 562.

Figure 6:
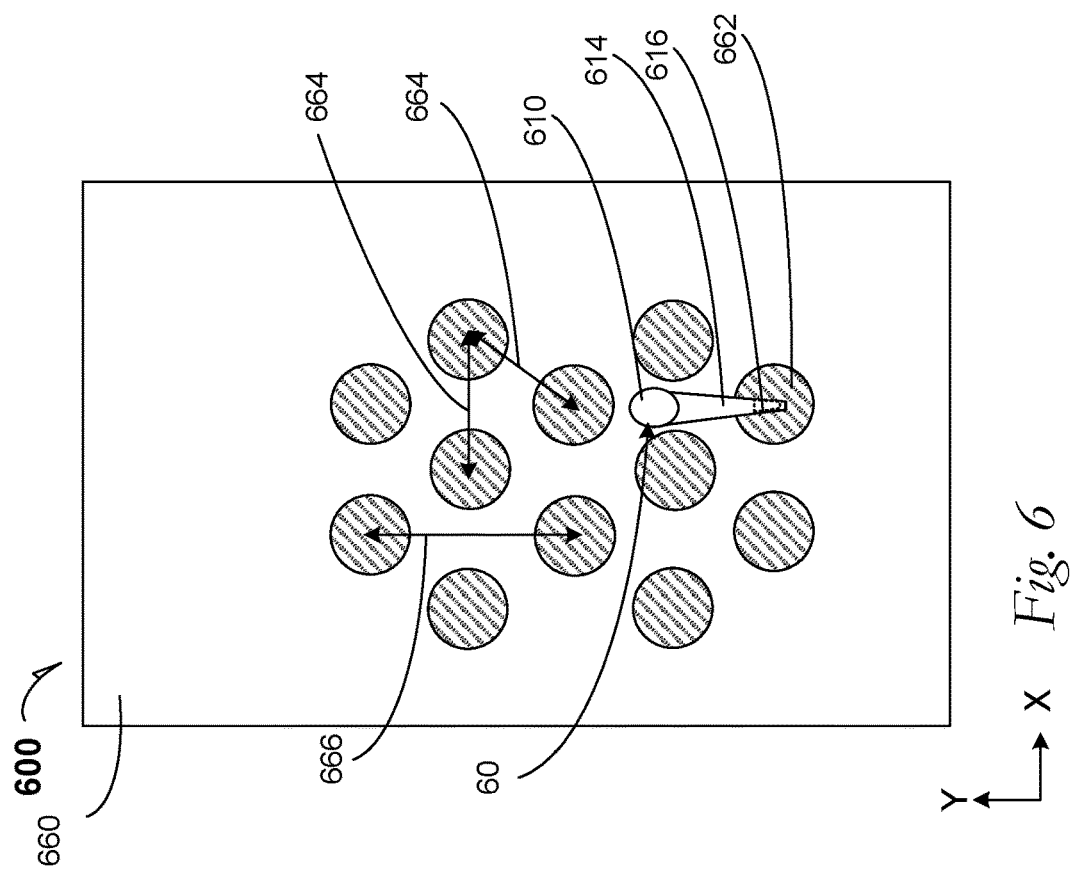
FIG. 6 is a top plan of a device under test according to an embodiment.

FIG. 6 is a top plan 600 of a device 660 under test according to an embodiment. In an embodiment the device 660 is semiconductive device such as a logic processor made by Intel Corporation of Santa Clara, Calif. The device under test (DUT) 660 is being probed at an electrical bump 662 that is part of a hexagonal-packed-pitch bump array. In an embodiment, the hexagonal-packed-pitch bump array has adjacent-bump pitches 664 of 36 μm and a trans-bump pitch 666 of 62 μm.

In an embodiment, a device probe 60 includes a probe body 610, a primary probe arm (not visible), and a subsequent probe arm 614. A probe foot 616 (in ghosted lines) extends (toward the plane of the drawing) to make contact with the electrical bump 662. In an embodiment where overtravel of the probe foot 616 occurs, the probe foot moves in the negative-Y direction away from the probe body 610, but it retains contact with the electrical bump 662.

Figure 7:
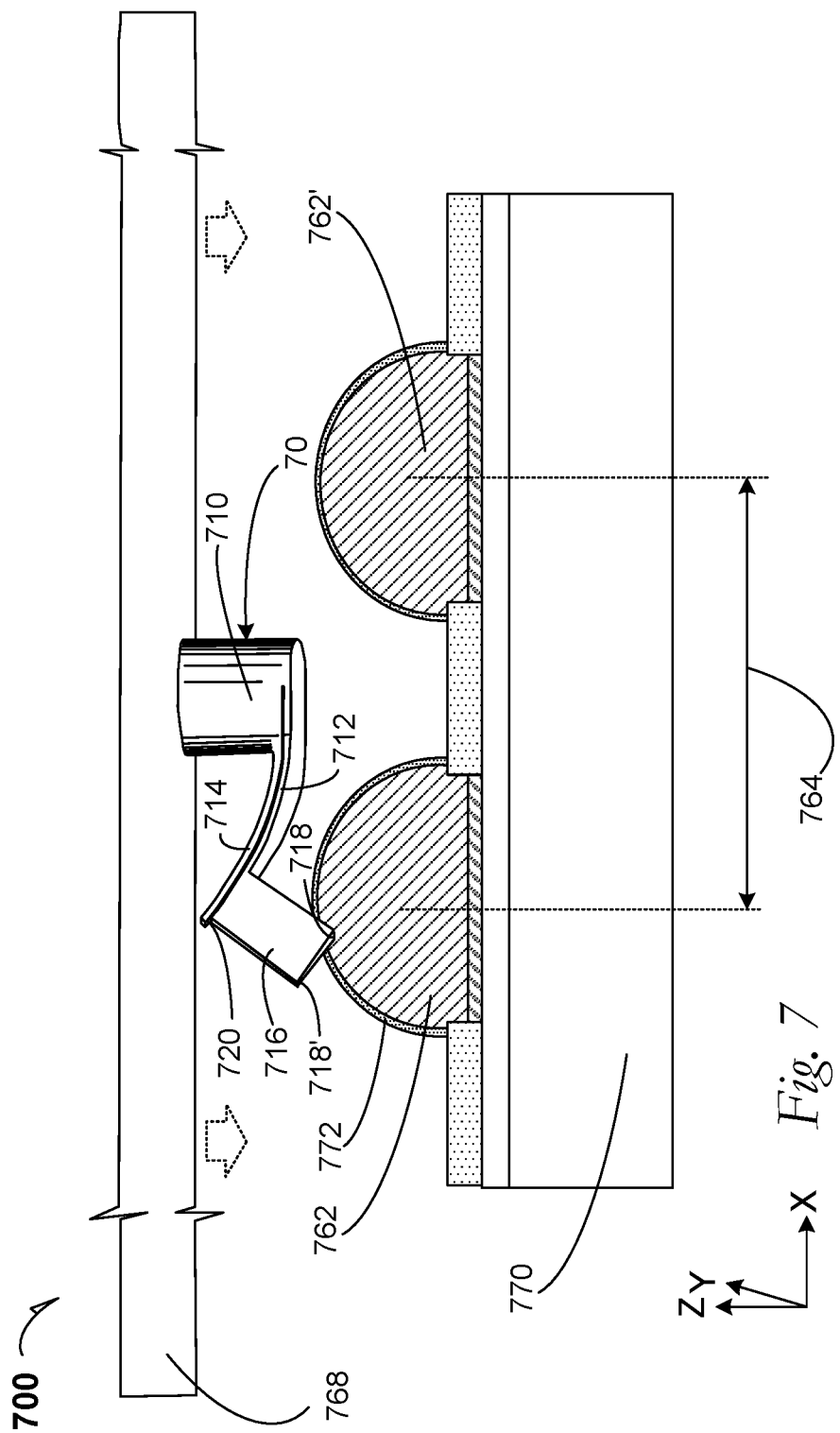
FIG. 7 is a perspective elevation of a device-under-test technique using a device probe according to an embodiment.

FIG. 7 is a perspective elevation 700 of a device-under-test technique using a device probe 70 according to an embodiment.

A DUT 770 such as a semiconductive device 770 includes an electrical bump 762 that is being contacted at a probe tip 718 of a probe foot 716 of a device probe 70, where a primary probe arm 712 and a subsequent probe arm 714 are deflected by sufficient overtravel that useful contact between the device probe 70 and the electrical bump 762 has been achieved. For example, an oxide film 772 is present on the electrical bump 762, and overtravel of the device probe 70 as well as lateral movement of the probe tip 718 has scrubbed through the oxide film 772 to achieve a useful electrical connection between the device probe 70 and the electrical bump 776. Similarly, the distal end 718' of the probe tip 718, moves in a range from 1 μm to about 26 μm where the probe tip 718 is the proximal end that makes physical and electrical contact during a DUT technique.

A probe card 768 carries the device probe 70 and the probe card has been moved downwardly (negative-Z direction) to allow overtravel of the probe foot 716, without the probe body 710 shorting into an adjacent electrical bump 762', whether by lateral shorting or vertical shorting. The orthogonal pitch 764 of two adjacent electrical bumps is larger than the un-deflected length of the device probe 70.

In an embodiment, the probe card 768 carries a plurality of device probes such as the device probe 70. In an embodiment, the probe card 768 carries a plurality of device probes such as eight device probes that are configured to allow overtravel of each probe foot on the corresponding device probe, without shorting into a neighboring electrical connection such as an electrical bump or a bond pad. In an embodiment, a plurality of device probes includes at least one variety illustrated in FIGS. 1A and 1B, and any other variety illustrated and described in any of FIGS. 2A and 2B, 3A and 3B, 4 and 10.

Figure 8:
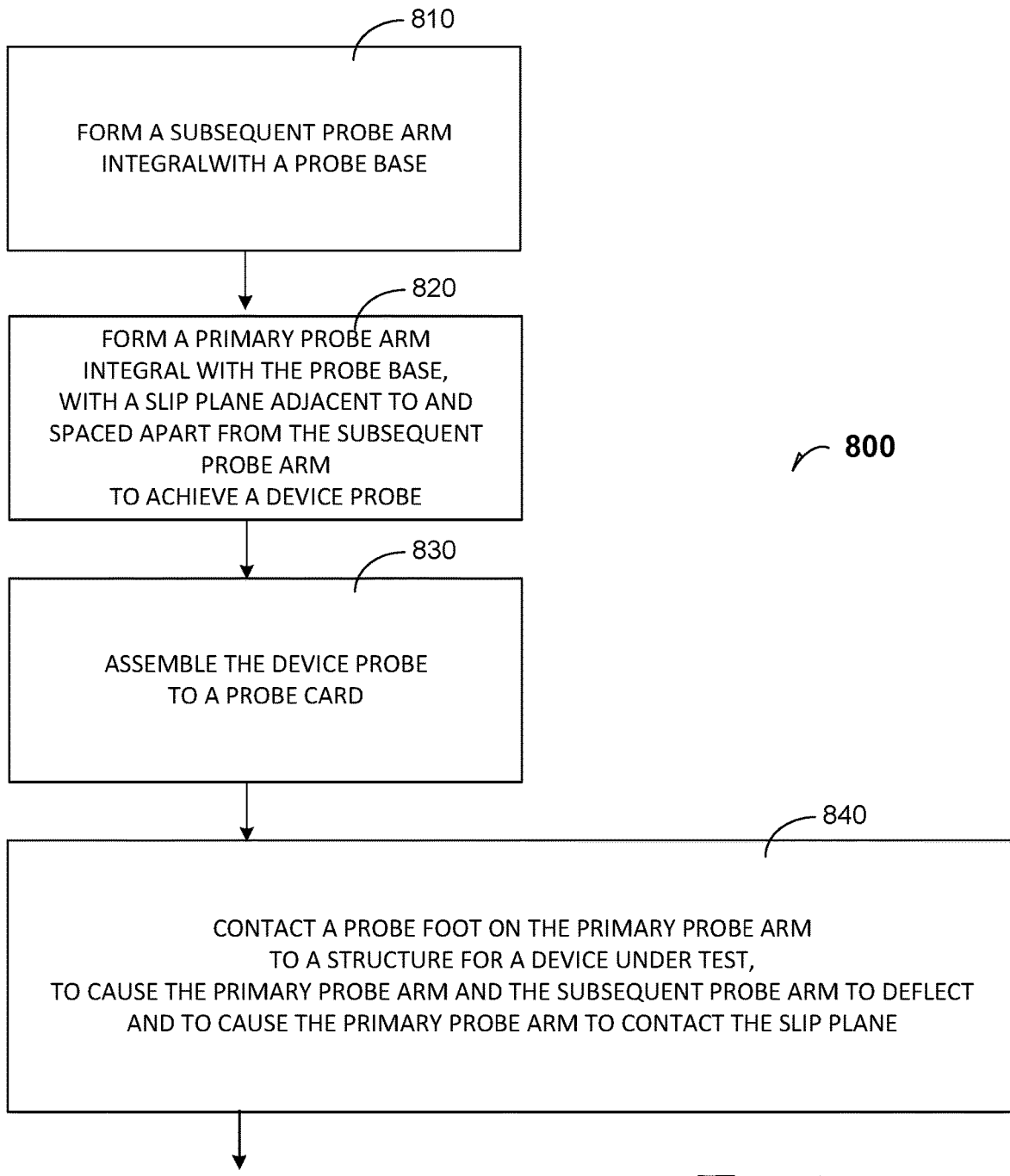
FIG. 8 is a process and method diagram according to several embodiments.

FIG. 8 is a process and method diagram according to several embodiments.

At 810, the process includes forming the subsequent probe arm integral with the probe base. The "subsequent probe arm" refers to the probe arm farthest from the primary probe arm, but it is formed first according to an embodiment.

At 820, the process includes forming the primary probe arm integral with the probe base and with a slip plane adjacent to and spaced apart from the subsequent probe arm. In a non-limiting example embodiment, a fugitive dielectric material is first formed on the subsequent probe arm without covering the probe base, and the primary probe arm is electroplated to the probe base. Next, the dielectric material is released to expose a slip plane and a slip-plane spacing.

At 830, the process includes assembling the device probe to a probe card.

At 840, a method is done by contacting a probe foot on the primary probe arm to cause overtravel that deflects the primary probe arm and that causes the primary probe arm to contact the subsequent probe arm at the slip plane.

Figure 9:
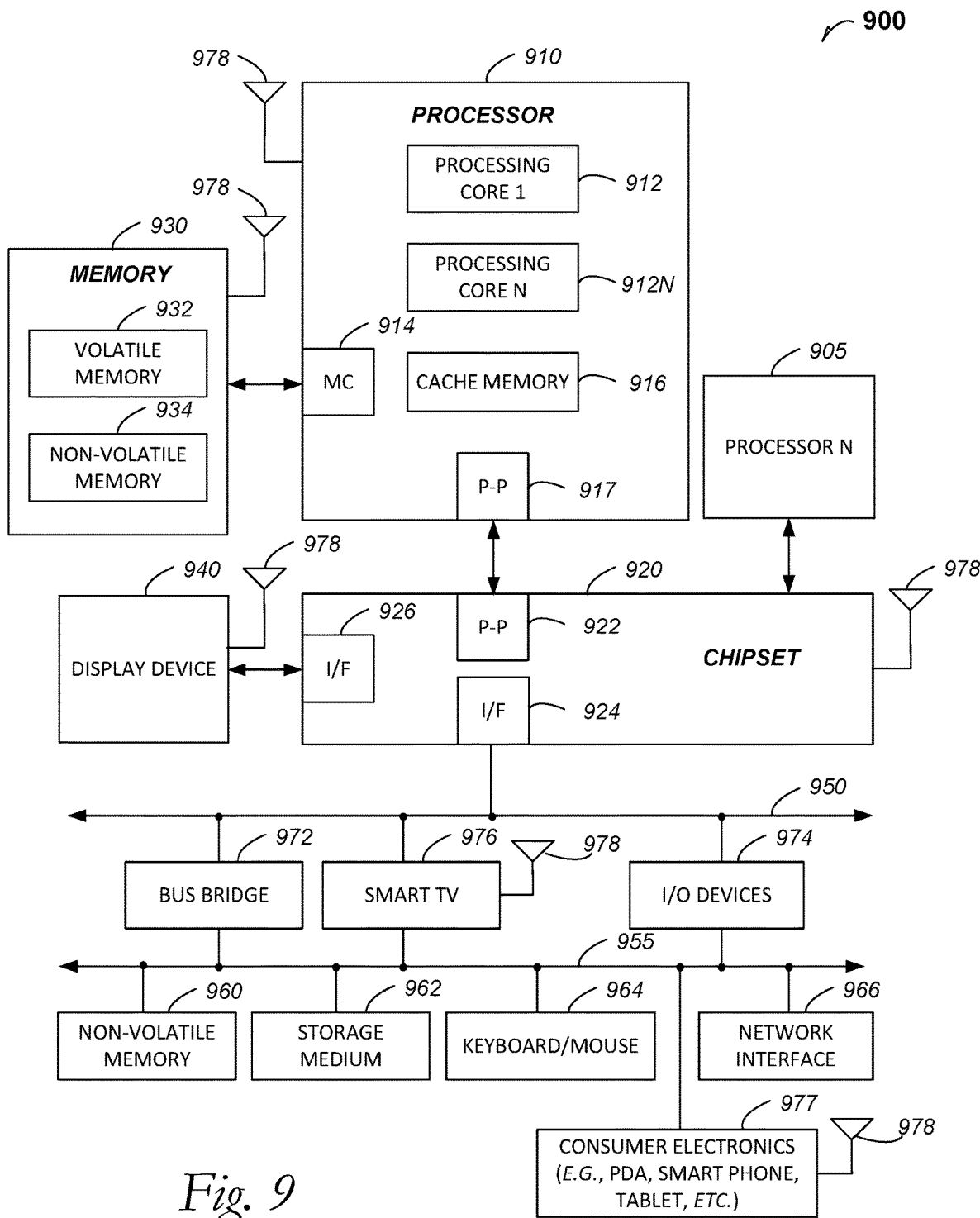
FIG. 9 is included to show an example of a higher-level device application using the device probe with several computing device components according to several embodiments.

FIG. 9 is a computing system 900 according to an embodiment. FIG. 9 illustrates a system level diagram, where testing using a device probe embodiment is done according several embodiments.

FIG. 9 is included to show an example of a higher-level device application for a computing system for testing using a device probe embodiment. In one embodiment, a system 900 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device.

In an embodiment, the processor 910 has one or more processing cores 912 and 912N, where 912N represents the Nth processor core inside processor 910 where N is a positive integer. In an embodiment, the electronic device system 900 is tested at any illustrated component by using a device probe embodiment, including testing any one of multiple processors including 910 and 905, where the processor 905 has logic similar or identical to the logic of the processor 910. In an embodiment, the processing core 912 includes, but is not limited to, pre-fetch logic to fetch instructions, decode logic to decode the instructions, execution logic to execute instructions and the like. In an embodiment, the processor 910 has a cache memory 916 to cache at least one of instructions and data for the multiple-flip chip, pillar- to bond-wire pad die stack-containing computing system 900. The cache memory 916 may be organized into a hierarchal structure including one or more levels of cache memory.

In an embodiment, the processor 910 includes a memory controller 914, which is operable to perform functions that enable the processor 910 to access and communicate with memory 930 that includes at least one of a volatile memory 932 and a non-volatile memory 934. In an embodiment, the processor 910 is coupled with memory 930 and chipset 920. The processor 910 may also be coupled to a wireless antenna 978 to communicate with any device configured to at least one of transmit and receive wireless signals. In an embodiment, the wireless antenna interface 978 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 932 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 934 includes, but is not limited to, flash memory, phase change memory (PCM), read-only memory (ROM), electrically erasable programmable read-only memory (EEPROM), or any other type of non-volatile memory device. In an embodiment, testing including testing any one of the memory devices is done using a device probe embodiment for the computing system 900.

The memory 930 stores information and instructions to be executed by the processor 910. In an embodiment, the memory 930 may also store temporary variables or other intermediate information while the processor 910 is executing instructions. In the illustrated embodiment, the chipset 920 connects with processor 910 via Point-to-Point (PtP or P-P) interfaces 917 and 922. Either of these PtP embodiments may be achieved using a semiconductive bridge as set forth in this disclosure. The chipset 920 enables the processor 910 to connect to other elements in the SiP device system 900. In an embodiment, interfaces 917 and 922 operate in accordance with a PtP communication protocol such as the Intel® QuickPath Interconnect (QPI) or the like. In other embodiments, a different interconnect may be used.

In an embodiment, the chipset 920 is operable to communicate with the processor 910, 905N, the display device 940, and other devices 972, 976, 974, 960, 962, 964, 966, 977, etc. The chipset 920 may also be coupled to a wireless antenna 978 to communicate with any device configured to at least do one of transmit and receive wireless signals.

The chipset 920 connects to the display device 940 via the interface 926. The display 940 may be, for example, a liquid crystal display (LCD), a plasma display, cathode ray tube (CRT) display, or any other form of visual display device. In an embodiment, the processor 910 and the chipset 920 are merged into a single SOC such as selected stair-stacked memory module SiP embodiments described herein. Additionally, the chipset 920 connects to one or more buses 950 and 955 that interconnect various elements 974, 960, 962, 964, and 966. Buses 950 and 955 may be interconnected together via a bus bridge 972. In an embodiment, the chipset 920 couples with a non-volatile memory 960, a mass storage device(s) 962, a keyboard/mouse 964, and a network interface 966 by way of at least one of the interface 924 and 904, the smart TV 976, and the consumer electronics 977, etc.

In an embodiment, the mass storage device 962 includes, but is not limited to, a solid state drive, a hard disk drive, a universal serial bus flash memory drive, or any other form of computer data storage medium. In an embodiment, testing the mass storage device 962 is done using a device probe embodiment on a device such as the principal mass-storage device 962. In one embodiment, network interface 966 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 9 are tested using device probe embodiments within the computing system 900, the functions performed by some of these blocks may be integrated within a single semiconductor circuit or may be implemented using two or more separate integrated circuits. For example, although cache memory 916 is depicted as a separate block within processor 910, cache memory 916 (or selected aspects of 916) can be incorporated into the processor core 912.

Figure 10:
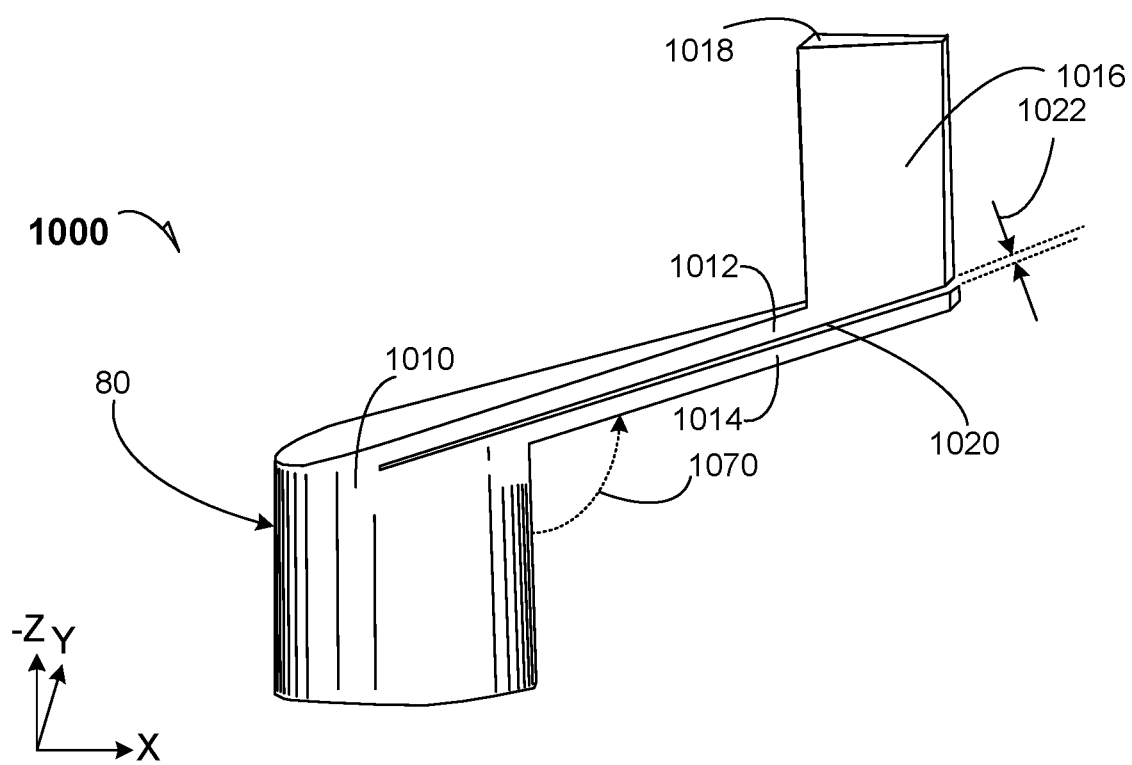
FIG. 10 is a perspective elevation of a device probe during use according to an embodiment.

FIG. 10 is a perspective elevation 1000 of a device probe 80 during use according to an embodiment. The device probe 80 includes a probe base 1010, a primary probe arm 1012 that is metallurgically an integral part of the bulk of the probe base 1010, as well as a subsequent probe arm 1014, that as well is metallurgically an integral part of the bulk of the probe base 1010. The device probe 70 also includes a probe foot 1016 and a probe tip 1018 that is part of the probe foot 1016.

Throughout this disclosure, the occurrence of a probe foot such as the probe foot 10016 is at a distal end of the probe arm such as the primary probe arm 112. The probe base such as the probe base 1010 is at a proximal end of the probe arm such as the primary probe arm 1012.

The probe foot 1016 includes the probe tip 1018, to make contact with an electrical structure for a DUT technique, such as at an electrical bump like a solder bump, at a copper pillar, or at a bond pad among other locations.

An obtuse angle 1070 is achieved between a sidewall of the probe base 1010 and the subsequent probe arm 1014, as compared to the several other disclosed probe arms being nominally orthogonal to a sidewall of the corresponding probe base. In an embodiment, an obtuse angle such as the obtuse angle 1070 allows for greater overtravel in the Z-direction, without the probe base contacting or nearly contacting an adjacent electrical structure such as the electrical bump adjacent the electrical bump 762 depicted in FIG. 7.

During deflection of the probe arms 1012 and 1014, the probe tip 1018 will travel laterally (X-direction) from an original reference length to a deflected reference length (see e.g., FIG. 1B). Similarly during deflection of the probe arms 112 and 114, the probe tip 118 will overtravel (Z-direction) from an original reference height to an overtravel distance (see e.g., the overtravel distance 124 in FIG. 1B). The overtravel distance is achieved to make a useful DUT contact with an electrical structure.

In an embodiment, the subsequent probe arm 1014 is separated from the primary probe arm 1012 by a primary slip plane 1020 that includes a primary slip spacing 1022 between the primary probe arm 1012 and the subsequent probe arm 1014.

In an embodiment, processing of the device probe 80 is done similarly to the device probe 10 depicted in FIG. 1A, and before assembly to a probe card, the angle 1070 is achieved by permanent mechanical shaping. In an embodiment, the device probe 80 has a probe-arm- and spacing configuration depicted in FIG. 1A, with an obtuse angle similarly to the illustration in FIG. 10. In an embodiment, the device probe 80 has a probe-arm- and spacing configuration depicted in FIG. 2A, with an obtuse angle similarly to the illustration in FIG. 10. In an embodiment, the device probe 80 has a probe-arm- and spacing configuration depicted in FIG. 3A, with an obtuse angle similarly to the illustration in FIG. 10. In an embodiment, the device probe 80 has a probe-arm- and organic film configuration depicted in FIG. 4, with an obtuse angle similarly to the illustration in FIG. 10.

To better illustrate the method and apparatuses disclosed herein, a non-limiting list of embodiments is provided here:

Example 1 is a device probe, comprising: a primary probe arm, wherein the primary probe arm is integral with a probe foot at a distal end and wherein the primary probe arm is integral with a probe base at a proximal end; a subsequent probe arm spaced apart from the primary probe arm, wherein the subsequent probe arm is integral with the probe base at a proximal end; and a primary slip spacing between the primary probe arm and the subsequent probe arm.

In Example 2, the subject matter of Example 1 optionally includes wherein an obtuse angle is achieved between a sidewall of the probe base and the subsequent probe arm.

In Example 3, the subject matter of any one or more of Examples 1-2 optionally include a probe card to which the probe base is attached and electrically coupled.

In Example 4, the subject matter of any one or more of Examples 1-3 optionally include wherein the primary probe arm has a first Z-thickness and the subsequent probe arm has a subsequent Z-thickness that is different from the first Z-thickness.

In Example 5, the subject matter of any one or more of Examples 1-4 optionally include wherein: the primary probe arm has a first Z-thickness and the subsequent probe arm has a subsequent Z-thickness that is different from the first Z-thickness; and wherein the primary slip spacing is equal to or greater than the subsequent Z-thickness.

In Example 6, the subject matter of any one or more of Examples 1-5 optionally include wherein: the primary probe arm has a first Z-thickness and the subsequent probe arm has a subsequent Z-thickness that is different from the first Z-thickness; wherein the primary slip spacing is equal to or greater than the subsequent Z-thickness; wherein the primary probe arm has a first ductility; wherein the subsequent probe arm has a subsequent ductility that is different from the primary probe arm ductility.

In Example 7, the subject matter of any one or more of Examples 1-6 optionally include wherein: the primary probe arm has a first ductility; and wherein the subsequent probe arm has a subsequent ductility that is different from the primary probe arm ductility.

In Example 8, the subject matter of any one or more of Examples 1-7 optionally include wherein the primary slip spacing is greater than or equal to the Z-thickness of either of the primary probe arm and the subsequent probe arm.

In Example 9, the subject matter of any one or more of Examples 1-8 optionally include a third probe arm between the primary probe arm and the subsequent probe arm, wherein the third probe arm is integral with the probe base at a proximal end, and wherein the third probe arm is spaced apart from the primary probe arm at the primary slip spacing, and from the subsequent probe arm.

In Example 10, the subject matter of any one or more of Examples 1-9 optionally include a third probe arm between the primary probe arm and the subsequent probe arm, wherein the third probe arm is integral with the probe base at a proximal end, and wherein the third probe arm is spaced apart from the primary probe arm at the primary slip spacing, and from the subsequent probe arm; wherein the primary probe arm has a first ductility; and wherein the subsequent probe arm has a subsequent ductility that is different from the primary probe arm ductility.

In Example 11, the subject matter of any one or more of Examples 1-10 optionally include a third probe arm between the primary probe arm and the subsequent probe arm, wherein the third probe arm is integral with the probe base at a proximal end, and wherein the third probe arm is spaced apart from the primary probe arm at the primary slip spacing; and a fourth probe arm between the third probe arm and the subsequent probe arm probe arm, wherein the fourth probe arm is integral with the probe base at a proximal end.

In Example 12, the subject matter of any one or more of Examples 1-11 optionally include a third probe arm between the primary probe arm and the subsequent probe arm, wherein the third probe arm is integral with the probe base at a proximal end, and wherein the third probe arm is spaced apart from the primary probe arm at the primary slip spacing; a fourth probe arm between the third probe arm and the subsequent probe arm probe arm, wherein the fourth probe arm is integral with the probe base at a proximal end; wherein the primary probe arm has a first ductility; and wherein the subsequent probe arm has a subsequent ductility that is different from the primary probe arm ductility.

In Example 13, the subject matter of any one or more of Examples 1-12 optionally include a third probe arm between the primary probe arm and the subsequent probe arm, wherein the third probe arm is integral with the probe base at a proximal end, and wherein the third probe arm is spaced apart from the primary probe arm at the primary slip spacing; a fourth probe arm between the third probe arm and the subsequent probe arm probe arm, wherein the fourth probe arm is integral with the probe base at a proximal end; wherein the primary probe arm includes a first length, the third probe arm includes a third length, the fourth probe arm includes a fourth length, and wherein the subsequent probe arm includes subsequent length, wherein any two of the lengths are different.

Example 14 is a device probe, comprising a primary probe arm, wherein the primary probe arm is integral with a probe foot at a distal end and wherein the primary probe arm is integral with a probe base at a proximal end; and an organic probe arm film adhered to the primary probe arm.

In Example 15, the subject matter of Example 14 optionally includes wherein an obtuse angle is achieved between a sidewall of the probe base and the subsequent probe arm.

In Example 16, the subject matter of any one or more of Examples 14-15 optionally include a probe card to which the probe base is attached and electrically coupled.

In Example 17, the subject matter of any one or more of Examples 14-16 optionally include wherein the organic probe arm film includes a plurality of anisotropic fibers that are arrayed within the organic probe arm film.

In Example 18, the subject matter of any one or more of Examples 14-17 optionally include wherein the organic probe arm film includes a plurality of anisotropic fibers that are arrayed within the organic probe arm film in a range from one to three.

Example 19 is a method of forming a probe arm, comprising: forming a primary probe arm integral to a probe base, wherein the primary probe arm is spaced apart from a subsequent probe arm by a fugitive material; and removing the fugitive material to form a slip spacing between the primary probe arm and the subsequent probe arm.

In Example 20, the subject matter of Example 19 optionally includes forming a third probe arm spaced apart from the subsequent probe arm by a fugitive material.

In Example 21, the subject matter of any one or more of Examples 19-20 optionally include wherein forming the primary probe arm includes forming a chemically different probe arm compared to the subsequent probe arm. In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A device probe, comprising:
   a primary probe arm cantilevered from a probe base, wherein the primary probe arm is integral with a probe foot at a distal end and wherein the primary probe arm is integral with the probe base at a proximal end, and wherein, in response to an overtravel of the device probe, the primary probe arm is to undergo a deflection in a Z-dimension; and
   a secondary probe arm cantilevered from the probe base, wherein:
      a proximal end of the secondary probe arm is integral with the probe base;
      a distal end of the secondary probe arm is spaced apart from the distal end of the primary probe arm in the Z-dimension by a primary slip spacing; and
      upon the deflection of the primary probe arm exceeding the primary slip spacing, the primary probe arm is to contact the secondary probe arm.

2. The device probe of claim 1, wherein the contact with the secondary probe arm physically reinforces the primary probe arm against further deflection in the Z-dimension.

3. The device probe of claim 1, further including a probe card to which the probe base is attached and electrically coupled.

4. The device probe of claim 1, wherein the primary probe arm has a first Z-thickness in the Z-dimension, and the secondary probe arm has a second Z-thickness in the Z-dimension that is different from the first Z-thickness.

5. The device probe of claim 1, wherein:
   the primary probe arm has a first Z-thickness in the Z-dimension, and the secondary probe arm has a second Z-thickness in the Z-dimension that is different from the first Z-thickness; and
   the primary slip spacing is equal to or greater than the second Z-thickness.

6. The device probe of claim 1, wherein:
   the primary probe arm has a first Z-thickness, in the Z-dimension, and the secondary probe arm has a second Z-thickness in the Z-dimension that is different from the first Z-thickness;
   the primary slip spacing is equal to or greater than the second Z-thickness;
   the primary probe arm has a first ductility; and the secondary probe arm has a second ductility that is different from the first ductility.

7. The device probe of claim 1, wherein:
the primary probe arm has a first ductility; and
the secondary probe arm has a second ductility that is different from the first ductility.

8. The device probe of claim 1, wherein the primary slip spacing is greater than or equal to a Z-thickness, in the Z-dimension, of either of the primary probe arm or the secondary probe arm.

9. The device probe of claim 1, further including another probe arm spaced apart in the Z-dimension from both the primary probe arm and the secondary probe arm, wherein a proximal end of the third probe arm is integral with the probe base.

10. The device probe of claim 1,
wherein the distal end of the primary probe arm is separated from the base by a first length, and wherein the distal end of the secondary probe arm is separated from the base by a second length, different than the first length.

11. A microelectronic device probe, comprising
a primary probe arm, wherein the primary probe arm is integral with a probe foot at a distal end and wherein the primary probe arm is integral with a probe base at a proximal end; and
an organic probe arm film adhered to the primary probe arm, wherein one or more anisotropic fibers are within the organic probe arm film.

12. The device probe of claim 11, wherein the primary probe arm is at an obtuse angle from a sidewall of the probe base.

13. The device probe of claim 11, further including a probe card to which the probe base is attached and electrically coupled, and wherein the device probe is one of a plurality of device probes attached to the probe card to contact a plurality of locations on a device under test having a pitch of no more than 51 μm.

14. The device probe of claim 11, wherein there are no more than three of the anisotropic fibers within the organic probe arm film.

15. The device probe of claim 11, further comprising:
a secondary probe arm spaced apart from the primary probe arm in a Z-dimension by a primary slip spacing, wherein the secondary probe arm is integral with the probe base at a proximal end; and
a primary slip spacing between the primary probe arm and the secondary probe arm, wherein upon a deflection in the Z-dimension of the primary probe arm that exceeds the primary slip spacing, the secondary probe arm is to reinforce the primary probe arm against a further deflection in the Z-dimension.

16. The device probe of claim 13, wherein the device probe is one of a plurality of device probes attached to the probe card to contact a plurality of locations on a device under test having a pitch of no more than 36 μm.

17. The device probe of claim 1, further including a probe card to which the probe base is attached and electrically coupled, and wherein the device probe is one of a plurality of device probes to contact a plurality of locations on a device under test having a pitch of no more than 51 μm.

18. The device probe of claim 17, wherein the device probe is one of a plurality of device probes attached to the probe card to contact a plurality of locations on a device under test having a pitch of no more than 36 μm.

* * * * *